United States Patent [19]

Thorp, Jr. et al.

[11] Patent Number: 4,756,080

[45] Date of Patent: Jul. 12, 1988

[54] METAL FOIL SEMICONDUCTOR INTERCONNECTION METHOD

[75] Inventors: C. Arthur Thorp, Jr., Santa Clara; Richard F. Cooley, Campbell, both of Calif.

[73] Assignee: American Microsystems, Inc., Santa Clara, Calif.

[21] Appl. No.: 822,712

[22] Filed: Jan. 27, 1986

[51] Int. Cl.⁴ .......................................... H01R 43/02
[52] U.S. Cl. .................................. 29/827; 174/52 FP
[58] Field of Search ..................... 29/827; 174/52 FP; 357/69, 70; 361/421

[56] References Cited

U.S. PATENT DOCUMENTS 3,698,074  10/1972  Helda et al. ........................... 29/418
4,616,412  10/1986  Schroeder ............................. 29/827

Primary Examiner—P. W. Echols
Attorney, Agent, or Firm—G. P. Edgell; E. E. Sachs

[57] ABSTRACT

A single layer copper foil tape is provided having a center core and connected lead beams. Etched apertures are formed to separate adjacent lead beams and to form relatively high strength foil straps connecting edge portions of the foil tape and the center core. Score lines may be etched at the ends of each of the lead beams to form breakaway links at such ends. The inner ends of the lead beams are then bonded to a semiconductor die at its contact pad or bumps and the resultant subassembly aligned with inner ends of the fingers of a metal lead frame array or other set of external leads such as a pin grid array and the outer ends of the lead beams bonded to such fingers. At this point, all of the remaining portions of the foil tape are peeled or pulled off the assembly, the lead beams being separated at their breakaway links, leaving only the lead beams connecting the die and set of external leads intact. The straps allow for simultaneous removal of the central foil stabilizing core when the remainder of the foil tape is pulled or peeled away from the connected lead beams.

10 Claims, 2 Drawing Sheets

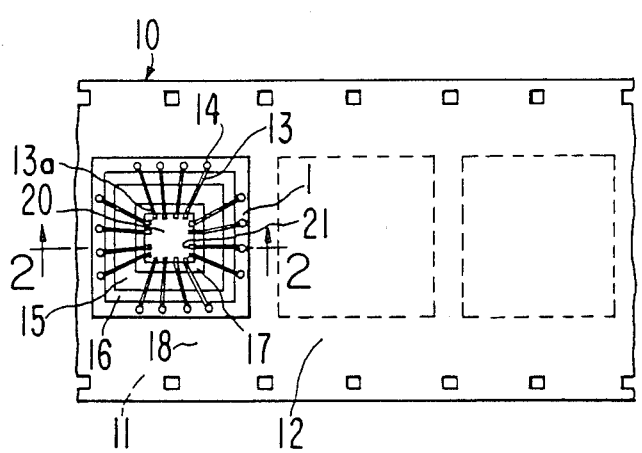
FIG. 1 PRIOR ART
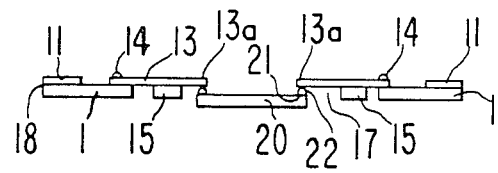
FIG. 2 PRIOR ART
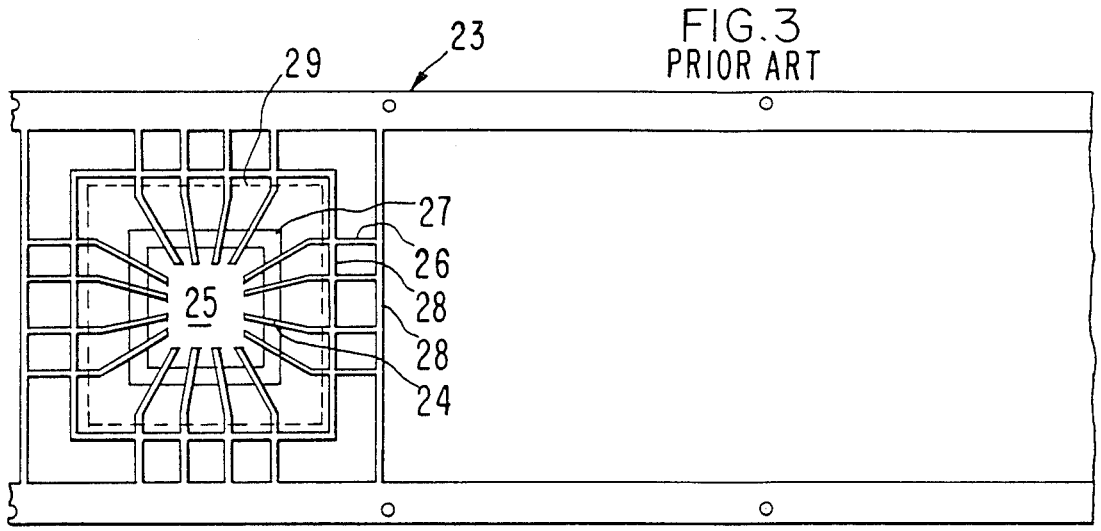
FIG. 3 PRIOR ART
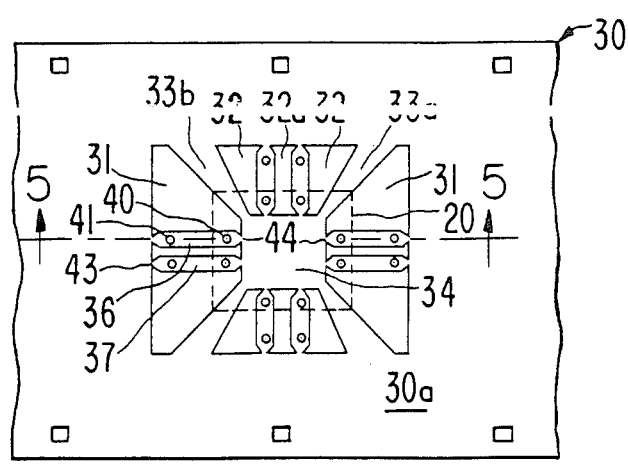
FIG. 4
FIG. 5

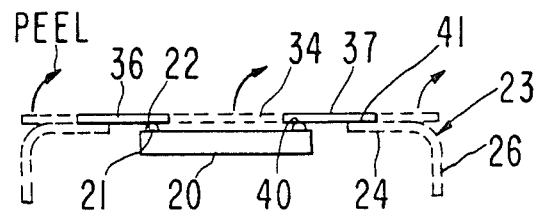
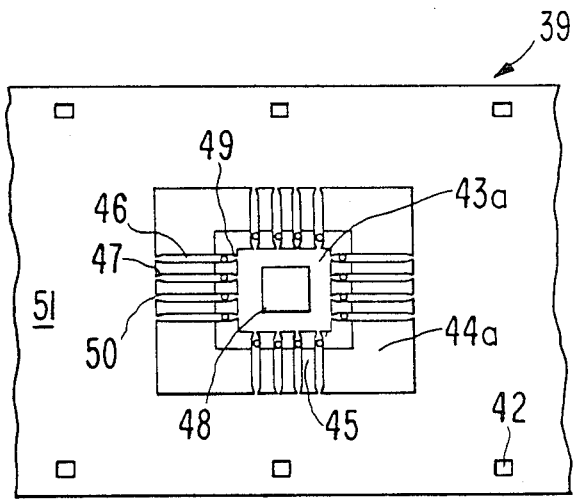
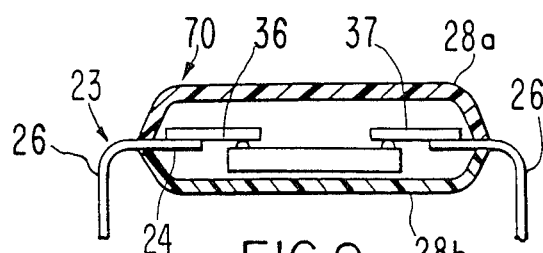
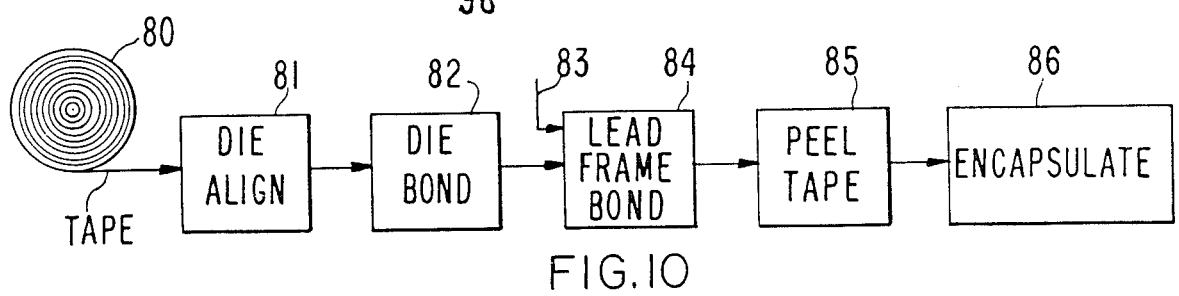

METAL FOIL SEMICONDUCTOR INTERCONNECTION METHOD

FIELD OF THE INVENTION

The present invention relates to the packaging of semiconductor integrated circuit packages, more particularly to the assembly of metal foil tape containing circuit metallization with the integrated circuit die and subsequently to the attachment of the tape and die to external leads and suitable encapsulation of the overall device.

BACKGROUND OF THE INVENTION

Semiconductor integrated circuit (IC) dies have multiple electrical contact pads which are connected through external electrical leads or thin film conductors to plug-in contacts which are surface bonded to other members on a printed circuit board. In production processes, tape automated bonding (TAB) has been employed where a strip of tape in reel form provides a plurality of groups of metallic parts and where each group includes interconnected finger contacts. These are connected at inner beam ends to die contact pads by soldering, compression bonding, or other means. The outer ends of finger contacts are bonded to a lead frame or outer metallic leads of the die package.

U.S. Pat. No. 3,689,991 shows a multi-layer tape wherein sets of finger-like leads are secured or formed by etching techniques on an insulative tape layer. Such insulative tape layer affords support for the thin leads during the die bonding and encapsulation process and partly remains part of the internal final assembly. Single-layer tape has also been employed which is similar to the multi-layer tape described above except that a thin copper foil is used without lamination to a polyimide layer alone or with an adhesive material. U.S. Pat. No. 4,234,666 shows TAB processing of thin, delicate copper foil including inner and outer gang bonding of the leads to the die and lead frame, respectively.

U.S. Pat. No. 4,259,436 illustrates a method of making a multi-layer tape carrier comprising a flexible tape of an insulation material and a metal foil adhering to the tape.

U.S. Pat. No. 4,380,042 discloses a TAB process including a lead carrier tape with or without a dielectric carrier and an internal stabilizing foil frame which, after inner leads are connected to die bonding pads, is pulled off the tape by applying a pull force on a tab to sever tear links adjacent the lead to die bond.

As can be seen, many of the above constructions employ a plastic film bonded to the metal foil tape to act as a mechanical carrier for the delicate leads of the tape metallization.

SUMMARY OF THE INVENTION

The present invention involves the use of a single layer metal foil tape which eliminates the use of a supporting plastic tape layer or tape picture frame to support the delicate metallization pathways or leads of the foil tape. Elimination of the plastic layer is estimated to have a prospective saving of 25¢ per unit, which, assuming a production of five million units per year, reflects a gross saving of 1.25 million dollars per year. The foil tape is used to form interconnections both between the IC die contacts and the tape and interconnections between the die attached tape and a lead frame, pin grid array or other set of exterior leads. The tape is designed to be self-supporting while the various bonding operations, die-to-tape inner lead bonding (ILB) and die-attached tape-to-outer lead bonding (OLB) are made. After both bonding operations but before encapsulation, the tape edges and tape center portions are peeled off the assembly leaving bridge-like connect beams extending from connect pads on the die to the inner fingers of the external leads. To accomplish this foil self-support, the foil leads formed by resist and etching techniques as known in the industry, are kept joined until after both inner lead bonding and outer lead bonding. The copper foil, including the foil indexed edges and central portion are removed at preweakened, tear-away links at locations on the foil adjacent the resultant attached bridge-like beams. Subsequently, the resultant assembly is encapsulated or otherwise placed in a protective plastic or ceramic package. In the case of plastic packages the outer leads of the lead frame are severed from each other to form discrete connector pins or leads, such as gull wing or J-leads, extending therefrom for subsequent connection to a printed circuit board or other substrate.

The method of the invention broadly encompasses providing a conductive foil assembly, hereinafter called a beam frame, containing spaced conductive paths or beams interconnected at both ends to an inner pad and outer lead frame structure, respectively by breakaway links. Prescribed areas of the foil are resist-coated and the remaining areas subjected to an etching step to remove unwanted foil. A partial etching or chemical milling or scoring step may be used to form the breakaway links. Normally the die is centrally mounted in the beam frame pattern. Contacts in the beams are bonded by soldering or welding generally to gold or copper bumps on the die bonding pads or on the metal foil beams to perform the inner lead bonding step. The resultant subassembly is then mounted centrally in a lead frame or other package aperture and the outer ends of the foil beams bonded to plated inner finger portions of the lead frame to perform the outer lead bonding step. The excess foil beam frame tape is then peeled off the assembly leaving bridge-like beams between each of the die contact pads and each of the inner fingers of the lead frame or set of exterior leads.

BRIEF DESCRIPTION OF THE DRAWINGS

FIG. 1 is a simplified schematic plan view of a prior art tape including a plastic support layer.

FIG. 2 is a side elevational view taken on line 2—2 of FIG. 1.

FIG. 3 is a simplified schematic plan view of a prior art lead frame to which is assembled the tape of FIG. 1 in the prior art.

FIG. 4 is a simplified schematic plan view of the beam tape of this invention ready for die-to-tape bonding.

FIG. 5 is a side elevation view of the tape taken on the line 5—5 of FIG. 4.

FIG. 6 is a simplified schematic side elevation view of the die-to-tape bond, the tape-to-lead frame bond and the peeling of excess tape from the assembly.

FIG. 7 is a simplified plan view of the beam tape showing an alternative configuration to facilitate peeling.

FIG. 8 is a partial cutaway side elevational view of a thermode for making individual die-to-tape bonds.

FIG. 9 is a partial cross-sectional elevational view of a complete integrated circuit package showing the die-to-tape and tape-to-lead frame bonds.

FIG. 10 is a schematic block diagram showing the sequence of steps of the interconnection method disclosed.

FIG. 11 is a simplified plan view of a pin grid array package embodiment to which the bond tape and attached die are affixed.

DETAILED DESCRIPTION

FIG. 1 shows a prior art assembly 10. A copper foil 11 attached to a polyimide or other plastic layer 1 and coated with tin solder 12 has beams 13 extending from inward pointing conductive fingers 13a to an outer peripheral position 18. Connector or test pads 14 may be formed as discrete areas at the outer periphery of each beam 13. Space 16 is etched or otherwise formed in the polyimide layer between the outer assembly portion 18 and a picture frame portion 15, providing an exposed portion of beams for later use in outer lead bonding to a package (not shown). An opening 17 is etched or otherwise formed from the polyimide layer 1 forming the inner edge of the support ring 15, providing an opening 17 for semiconductor die 20, and support for inward pointing conductive fingers 13a. An integrated circuit die 20 with contact pads 21 is placed in the center of the assembly and bumps 22 bonded to conductive fingers 13a.

FIG. 2 shows a cross section of the prior art interconnect of FIG. 1 showing the remaining polyimide 1 and plastic support ring 15 supporting fingers 13. The inner ends 13a of the fingers 13 are attached to bump 22 on the die 20 or bumps formed on the fingers 13 to contact pads 21.

FIG. 3 shows a prior art lead frame 23 which receives by known automated methods in the center aperture 25 one of the foil subassemblies of FIG. 1. Fingers 13 of the subassembly are solder bond connected or welded to the inner ends of plated fingers 24 of the lead frame which are stabilized by plastic foil tape frame 27. After encapsulation to form a package (shown in dotted lines 29) the connecting links 28 are severed leaving connector pins 26 extending from the package.

FIG. 4 illustrates the claimed invention which dispenses with the polyimide plastic foil tape frames of the FIG. 1 construction by having a foil only tape 30. Cutouts 31, 32 and 32a are formed in each quadrant of a tape pattern by etching, milling, punching or otherwise cutting away the foil leaving foil beams 36 and 37 therebetween. The beams 36 and 37 remain interconnected by necked-down weakened portions 43 and 44 at both ends of each beam. Integral foil straps 33a and 33b also remain and are of sufficient minimum width to provide a strong connection extending from the tape periphery 30a to the foil tape center 34. The die 20 is placed under center 34 (FIG. 6) and attached at its contact pads 21, or bumps 22 if utilized, to the inner chip-connect areas 40 of the beams 36, 37. Areas 40 are normally solder coated as discrete dots or stripes or the entire length of the lead beams 36 and 37 are coated with tin or other solder material.

The foil 30 with attached die 20 is then brought to the lead frame 23 and the inner tips of lead frame fingers 24 are welded or solder bonded to the underside of the outer lead frame connect areas 41 of lead beams 36 and 37. At this point, the beams 36 and 37 are firmly bonded to and act as a bridge between the die and the lead frame fingers. The metal foil is then peeled off (FIG. 6) with the straps 33a and 33b pulling or lifting off the foil center 34 from the top of die 20. Only the beams 36 and 37 attached between the die and lead frame inner ends, remain in place. The weakened portions 43 and 44 break during the peeling action allowing the index edge peripheral portions 30a, the straps 33a and 33b and the center 34 to be removed. The resultant assembly is then encapsulated or fitted in an outer package 28 with contact leads extending therefrom.

FIG. 5 shows the one layer nature of foil tape 30 with die 20 attached. Tape 30 is normally thin copper foil.

FIG. 6 schematically shows the welding or solder bonding of the bumps 22 to the chip-contact pad 21 or to the inner chip-connect areas 40 of lead beams 36 and 37 to form a subassembly and the connecting of the lead frame 23 to the subassembly by welding or solder bonding the lead frame-connected areas 41 of the lead beams 36 and 37 to the inner fingers 24 of the lead frame. A suitable solder coating, solder stripe or spot silver or gold plated pad 38 is normally provided on the lead frame inner ends 24 to facilitate a gang bonding operation. After lead frame bonding, the foil tape peripheral edge portions 30a, the straps 33a and 33b and the supporting center portion 34 are peeled off by appropriate mechanical action. Interconnecting links 43 and 44 are severed after the subassembly is bonded to the inner ends of the lead frame fingers 24 and before encapsulation to form the package assembly. The above described peeling action leaves only the interconnecting lead beams 36 and 37 permanently adhered in their desired locations (between the die contact pads and the inner ends of the fingers of the lead frame) and has removed all of the supporting and electrically shorting metal foil from the remaining structure.

FIG. 7 shows an alternative configuration in which the inner ends of the lead beams are scored by etching to form breakable links adjacent a separate center support core of the foil and an aperture provided in the core to enable the core to be removed from the lead beams after their connection to the die and lead frame. The foil tape 39, having sprocket holes 42 on its edges to fit assembly equipment, has a series of lead beams 46 and 47 formed on surface 51. Inner ends of the lead beams 46 and 47 are scored to form links 49 and are initially connected to a center core 43a of the foil tape 39. Etched apertures 44a separate each side group of lead beams and etched apertures 45 separate the adjacent lead beams 46 and 47, except for the breakaway inner links 49 and breakaway outer links 50. An aperture 48 is provided in the foil core 43a to facilitate removal of the core by grabbing the aperture edges and pulling the core off after inner lead beam bonding and after outer lead beam bonding.

FIG. 8 illustrates a thermode in magnified form which can be utilized to make the required solder bond connections at the inner die-connect and the lead beams. Die 20 is supported on an anvil 60 and the outer edges of the tape subassembly 30 of FIG. 4 placed over contact pads 37 or die bumps 38. Heated thermode 61 is moved toward anvil 60 and the solder is flowed by the resultant heat input to make the solder bond connection between die 20 and tape subassembly 30.

FIG. 9 illustrates a cross section of the final package 70 which is placed over the assembly of the die 20, attached lead beams 36 and 37 and the inner ends 24 of the lead frame 23. The package 28 may be in two joined halves 28a and 28b or the interconnect structure may be completely encapsulated by integral electrical insulation material. Lead frame connector pins 26 extend from the completed package as is known in the art.

FIG. 10 schematically illustrates the principal method steps of this invention. The foil tape, suitably patterned and plated with metallization to provide the lead beams and etched to form the lead beam separation apertures and foil center core removal straps, is first indexed from a tape reel 80 or other pretreatment station to a die-align station 81 where the die pads or bumps are aligned and registered with corresponding ones of the die-connect areas or bumps on inner ends of the lead beams. The respective bumps are welded or solder bonded to the lead beam die-connect areas simultaneously by gang-bonding with a series of thermodes or one overall thermode. The resultant subassembly is indexed to a lead frame align and lead frame bond station 84 where the outer ends of the lead beams of the subassembly of tape and die are bonded to the inner fingers of the lead frame. Lead frame 83 is separately indexed into station 84. The foil tape is then peeled or pulled off the assembly in station 85 leaving the lead beams only connecting the die to the lead frame fingers. Suitable clamp and pull apparatus as is known in the art may be employed to grasp and peel the tape from the assembly. Lastly the assembly is encapsulated in station 86 by a suitable polymer such as an epoxy resin.

FIG. 11 shows a pin grid array package 90 having a central aperture 91 and a series of conductive traces or set of exterior leads 92 extending from the aperture 91 to individual ones of a series of terminals 93 on a printed circuit board or other substrate 94. Terminals 93 may be pin terminals which extend outwardly from the top or bottom side of the substrate 94. A beam frame assembly 95, such as shown in FIGS. 4 or 7, is placed within aperture 91 and the outer connect areas 41 bonded to respective ones of the ends 96 of traces 92. After this bonding is made simultaneously to each of the traces the unwanted tape portions e.g. the edge portions 30a, straps 33a, 33b and center 34, are peeled off the package 90 leaving only the beams 36, 37 bridging between the bonded die and the array traces 92.

The above description of embodiments of this invention is intended to be illustrative and not limiting. Other embodiments of this invention will be obvious to those skilled in the art in view of the above disclosure.

We claim:

1. A method of automated bonding an integrated circuit die having contact pads to a beam frame and the beam frame to a set of exterior leads comprising:
   providing a single layer conductive foil beam frame having side edges and an inner portion;
   cutting away a series of areas in said beam frame such that remaining areas of said beam frame form a series of lead beams, each of said lead beams having their inner ends and outer ends interconnected respectively to inner ends and outer ends of immediately adjacent lead beams, each of said lead beams having an inner chip-connect area and an outer lead connect area;
   partially etching away peripheral edge portions of each of said lead beams inward of said inner chip-connect area and outward of said outer lead connect area to form severable links;
   positioning said integrated circuit die on said inner portion of said beam frame with said die contact pads in registration to said inner chip-connect areas;
   attaching said contact pads of said integrated circuit die to said inner chip-connect areas of said beam frame;
   placing said beam frame and attached die in registration with a series of external leads, said series of external leads spaced inner fingers such that each outer lead connect area of said beam frame is aligned with one of said spaced inner fingers;
   attaching said outer lead connect areas to said spaced inner fingers to form an assembly; and
   peeling said side edges and said inner portion of said beam frame from said assembly with sufficient force to break said partially etched peripheral edge portions and said severable links of said lead beams such that said lead beams alone of said beam frame are left extended between said chip-connect areas and said outer lead connect areas and remaining portions of said conductive foil beam frame are removed from the assembly.

2. The method of claim 1 further comprising encapsulating the assembly with an insulative material to form a package and wherein outwardly facing extensions of said spaced fingers form connector leads extending from said package.

3. The method of claim 1 further comprising coating at least all electrical connect surfaces of said foil with a solder material prior to attaching said die to said beam frame.

4. The method of claim 1 further comprising providing a series of integral foil straps between side edges of said beam frame and a center part of said beam frame for peeling off said center part of said beam frame when said side edges are peeled from said lead frame.

5. A method of interconnecting an integrated circuit die having die contact pads thereon to a set of external leads having connector leads extending therefrom comprising:
   providing a single layer conductive foil beam frame having interconnected beam lengths thereon, each beam length being separable at each end by breakaway sections and wherein each beam length extends from an inner position to an outer position, said inner position being located to overlie peripheral edges of a juxtaposed integrated circuit die;
   positioning said integrated circuit die overlapping an inner portion of said beam frame with said die contact pads in registration to inner portions of said beam lengths;
   attaching respective ones of said die contact pads to ones of said inner portions of said beam lengths to form a subassembly;
   providing a set of external leads having an interior aperture and a series of conductive fingers extending outwardly from said aperture;
   positioning said subassembly in registration to said interior aperture with an outer portion of said beam frame aligned with inner portions of said series of conductive fingers;
   attaching ones of said inner portions of said series of conductive fingers to aligned ones of said outer portions of said beam lengths: and
   simultaneously removing all of said beam frame away from said set of external leads except for said beam lengths attached between said die contact pads and said inner portions of said series of conductive fingers by breaking away said breakaway sections and forming an interconnected assembly.

6. The method of claim 5 further comprising encapsulating the assembly with an insulative material to form a package and wherein outwardly facing extensions of said conductive fingers form connector leads extending from said package.

7. The method of claim 5 further comprising coating at least all electrical connect surfaces of said foil with a solder material and soldering said die to said beam frame.

8. The method of claim 5 further comprising providing a series of integral foil straps between side edges of said beam frame and a center part of said beam frame for peeling off said center part of said beam frame when said side edges are peeled from said lead frame.

9. The method of claim 5 in which said set of external leads is a lead frame.

10. The method of claim 5 in which said set of external leads are conductive traces of a pin grid array.

* * * * *